United States Patent
Lemberg et al.

(10) Patent No.: US 11,699,916 B2
(45) Date of Patent: Jul. 11, 2023

(54) METHOD FOR CHARGING A BATTERY USING A THERMAL MODEL FOR AN ELECTRICAL DEVICE CONNECTED TO THE BATTERY

(71) Applicant: BAE Systems Controls Inc., Endicott, NY (US)

(72) Inventors: Nicholas A. Lemberg, Endwell, NY (US); Liam Collins, Binghamton, NY (US)

(73) Assignee: BAE Systems Controls Inc., Endicott, NY (US)

(*) Notice: Subject to any disclaimer, the term of this patent is extended or adjusted under 35 U.S.C. 154(b) by 106 days.

(21) Appl. No.: 17/524,965

(22) Filed: Nov. 12, 2021

(65) Prior Publication Data

US 2023/0155408 A1    May 18, 2023

(51) Int. Cl.
  *H02J 7/00*    (2006.01)
  *B60L 53/60*   (2019.01)
  *B60L 58/24*   (2019.01)
  *G01R 31/382*  (2019.01)
  *G01R 31/374*  (2019.01)
  *G05B 17/02*   (2006.01)

(52) U.S. Cl.
  CPC ........ *H02J 7/007192* (2020.01); *B60L 53/60* (2019.02); *B60L 58/24* (2019.02); *G01R 31/374* (2019.01); *G01R 31/382* (2019.01); *G05B 17/02* (2013.01); *H02J 7/00714* (2020.01)

(58) Field of Classification Search
  CPC .............................. H02J 7/007192
  USPC ....................................................... 320/152
  See application file for complete search history.

(56) References Cited

U.S. PATENT DOCUMENTS 4,573,132 A    2/1986   Boothman et al.
5,761,018 A    6/1998   Blakely
(Continued)

OTHER PUBLICATIONS

Rao et al., "Temperature Regulation in Multicore Processors Using Adjustable-Gain Integral Controllers", IEEE Conference on Control Applications, Jul. 22, 2015, pp. 1-8, School of Electrical and Computer Engineering, Georgia Institute of Technology, Atlanta, GA.

(Continued)

*Primary Examiner* — Yalkew Fantu
(74) *Attorney, Agent, or Firm* — Scully Scott Murphy & Presser PC

(57) ABSTRACT

A method for charging a battery includes coupling an electrical device in a circuit between the battery and an electrical power source. The electrical device having on and off states that are mechanically different. The method includes charging the battery by setting the electrical device to the on state, measuring current flowing through contacts of the electrical device while in the on state, determining current as a function of time flowing through the contacts of the electrical device, using the current as a function of time as a variable in a thermal model based on heating of the contacts and cooling of the contacts, determining by the thermal model a predicted temperature of the contacts based on the current as a function of time and the heating and cooling of the contacts and controlling the on and off state of the electrical device based on the predicted temperature.

20 Claims, 8 Drawing Sheets

(56) References Cited

U.S. PATENT DOCUMENTS

| | | | |
|---|---|---|---|
| 8,446,127 B2 * | 5/2013 | Yazami | H01M 10/443 |
| | | | 320/152 |
| 9,703,337 B2 | 7/2017 | James et al. | |
| 10,101,377 B2 | 10/2018 | Kuhn | |
| 10,242,828 B2 | 3/2019 | Cois | |
| 2001/0000212 A1 | 4/2001 | Reipur et al. | |
| 2002/0175654 A1 | 11/2002 | Takano et al. | |
| 2005/0017692 A1 | 1/2005 | Izumi et al. | |
| 2007/0069691 A1 | 3/2007 | Fukuda | |
| 2012/0226483 A1 | 9/2012 | Berry et al. | |
| 2013/0278269 A1 | 10/2013 | Steck et al. | |
| 2013/0317664 A1 * | 11/2013 | James | H02P 29/68 |
| | | | 700/299 |
| 2014/0021898 A1 | 1/2014 | Hendrickson et al. | |
| 2014/0239741 A1 * | 8/2014 | Cade | H03K 17/14 |
| | | | 307/117 |
| 2014/0331780 A1 | 11/2014 | Squires et al. | |
| 2016/0204626 A1 * | 7/2016 | Cruz | H02J 7/007192 |
| | | | 320/152 |
| 2017/0018384 A1 | 1/2017 | Cois | |
| 2018/0069272 A1 | 3/2018 | Seo et al. | |
| 2020/0343755 A1 * | 10/2020 | Jang | G01R 31/382 |

OTHER PUBLICATIONS

International Search Report, PCT/US22/48812, dated Feb. 1, 2023, 14 pages.

* cited by examiner

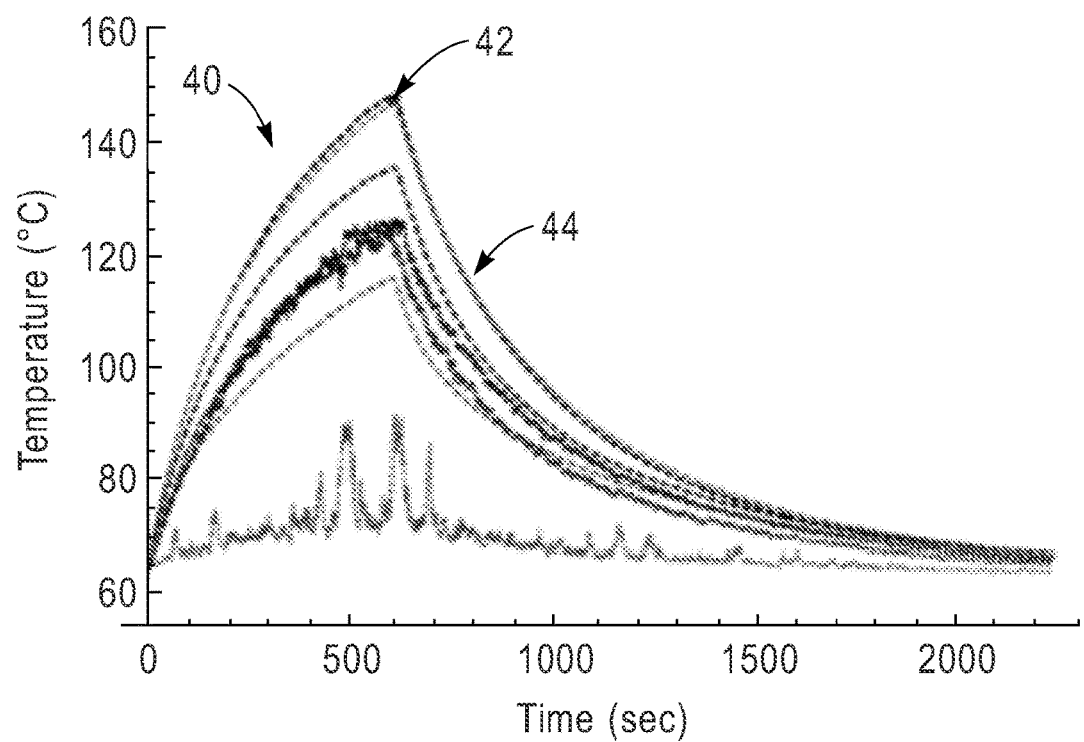
FIG. 3
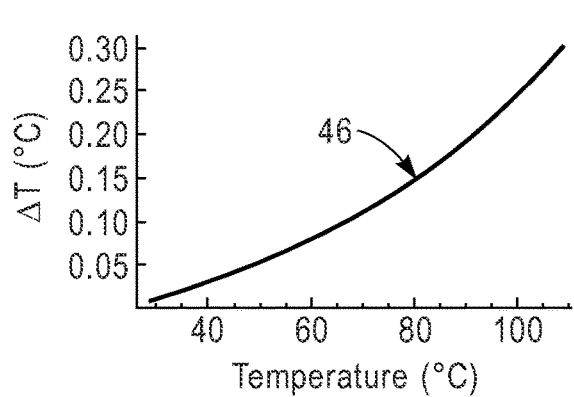 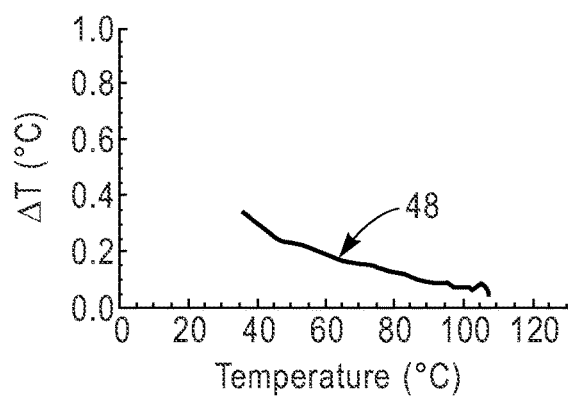
FIG. 4A                    FIG. 4B

METHOD FOR CHARGING A BATTERY USING A THERMAL MODEL FOR AN ELECTRICAL DEVICE CONNECTED TO THE BATTERY

BACKGROUND

The present disclosure relates generally to protecting electrical devices from thermal overload and more particularly to a thermal model for predicting temperature as a function of time of the electrical device during operation.

Many electrical devices operate under a series of on/off cycles in their normal operation. Current running through the device during the on periods heats the device and the device cools during the off periods. Some electrical devices have cooling structures attached to reduce the heating caused by the current flow during the on cycle and to speed cooling during the off cycle.

One such electrical device is an electromagnetic contactor. Electric vehicles run on large battery packs that need to be periodically charged. A high voltage charging source is connected to the battery packs to charge the packs. Electromagnetic contactors are connected between the high voltage charging source and the battery packs. Heat is generated in the contactors during charging and thermal overload can cause the contactors to fail.

BRIEF SUMMARY

In one embodiment, a method for charging a battery is disclosed that includes coupling an electrical device in a circuit between the battery and an electrical power source, the electrical device having an on state configured to connect the power source to the battery and an off state configured to disconnect the power source from the battery, the on and off states being mechanically different states of the electrical device; charging the battery by setting the electrical device to the on state; measuring current flowing through contacts of the electrical device while the electrical device is in the on state; determining current as a function of time flowing through the contacts of the electrical device; using the current as a function of time as a variable in a thermal model based on heating of the contacts and cooling of the contacts; determining by the thermal model a predicted temperature of the contacts based on the current as a function of time and the heating and cooling of the contacts; and controlling the on and off state of the electrical device based on the predicted temperature.

In one embodiment, a method for generating a thermal model for an electrical device is disclosed in which an electrical device having electrical contacts is provided. In one embodiment, the electrical device has an on state in which the contacts are closed connecting the electrical device to a load drawing current and an off state in which the contacts are open disconnecting the electrical device from the load. In one embodiment, the electrical device is connected to a cooling structure during both the on and off states.

In one embodiment, the method includes performing an on/off cycle by running a test current through the electrical device for a specified time period while the electrical device is in the on state and turning off the test current for a second specified time period while the electrical device is in the off state. In one embodiment the method includes measuring the temperature of the electrical device during the on/off cycle, generating an on/off cycle temperature curve of temperature versus time based on the on/off cycle temperature measurements, extracting a heating curve from the on/off cycle temperature curve, the heating curve representing both heating and cooling of the electrical device during the on cycle mand extracting a cooling curve from the on/off cycle temperature curve, the cooling curve representing cooling of the electrical device during the off cycle.

In one embodiment, the method includes calculating a heating change in temperature as a function of temperature curve based on the extracted heating curve and calculating a cooling change in temperature as a function of temperature curve based on the extracted cooling curve. In one embodiment, the method includes generating an on/off cycle heating behavior curve by combining the heating temperature change curve and the cooling temperature change curve and generating a thermal model for the electrical device based on the on/off cycle heating behavior curve and the calculated heating change in temperature as a function of temperature and the calculated cooling change in temperature as a function of temperature. In one embodiment, the method includes predicting temperature as a function of time of the electrical device using the thermal model.

In some embodiments, calculating the heating change in temperature as a function of temperature includes calculating a derivative of the heating curve and calculating the cooling change in temperature as a function of temperature includes calculating a derivative of the cooling curve. In some embodiment, the thermal model is recursive such that the predicted temperature at each time point of the function is based on the predicted temperature at the immediate previous time point.

In some embodiments, predicting temperature as a function of time is based on current as a function of time. In some embodiments, the thermal model calculates the predicted temperature as a function of time (t) by multiplying the square of the test current at time (t) by the temperature from the on/off cycle heating behavior curve at time (t-1), minus the temperature from the cooling change in temperature curve at time (t-1), plus the predicted temperature at time (t-1). In some embodiments, the test current is normalized in the predicted temperature calculation by dividing the square of the test current at time (t) by predetermined current value.

In one embodiment, the electrical device is a magnetic contactor coupled in a circuit for charging a battery pack for an electric or hybrid electric vehicle. In one embodiment the method includes determining a time of charging at which the contactor fails based on the thermal model and charging the battery pack for a time less than the determined contactor fail time.

In one embodiment, the method includes performing a plurality of the an/off cycles on the electrical device, at each on/off cycle measuring the temperature of the electrical device at a different physical point on the electrical device and generating an on/off cycle temperature curve of temperature versus time for each different physical point. In one embodiment, the heating curve and the cooling curve are extracted from the on/off cycle temperature curve having the highest on/off cycle temperature measurements.

In one embodiment, a system for predicting temperature as a function of time of an electrical device is disclosed, in which the electrical device having electrical contacts is provided. In one embodiment, the electrical device has an on state in which the contacts are closed connecting the electrical device to a load drawing current and an off state in which the contacts are open disconnecting the electrical device from the load. In one embodiment, the electrical device is connected to a cooling structure during both the on and off states. In one embodiment, the system includes one or more computer processors, one or more non-transitory computer-readable storage media, and program instructions, stored on the one or more non-transitory computer-readable storage media, which when implemented by the one or more processors, cause the system to perform the steps of generating a thermal model for the electrical device.

In one embodiment, the system includes performing an on/off cycle by running a test current through the electrical device for a specified time period while the electrical device is in the on state and turning off the test current for a second specified time period while the electrical device is in the off state, measuring the temperature of the electrical device during the on/off cycle, generating an on/off cycle temperature curve of temperature versus time based on the on/off cycle temperature measurements, extracting a heating curve from the on/off cycle temperature curve, the heating curve representing both heating and cooling of the electrical device during the on cycle, extracting a cooling curve from the on/off cycle temperature curve, the cooling curve representing cooling of the electrical device during the off cycle, calculating a heating change in temperature as a function of temperature curve based on the extracted heating curve, calculating a cooling change in temperature as a function of temperature curve based on the extracted cooling curve, generating an on/off cycle heating behavior curve by combining the heating temperature change curve and the cooling temperature change curve and generating a thermal model for the electrical device based on the on/off cycle heating behavior curve and the calculated heating change in temperature as a function of temperature and the calculated cooling change in temperature as a function of temperature. In one embodiment, the system predicts temperature as a function of time of the electrical device using the thermal model.

In one embodiment, a computer program product having program instructions on a computer-readable storage medium is disclosed, where execution of the program instructions using a computer causes the computer to perform a method for generating a thermal model for an electrical device, the electrical device having electrical contacts, wherein in an on state the contacts are closed connecting the electrical device to a load drawing current and in an off state the contacts are open disconnecting the electrical device from the load, the electrical device being connected to a cooling structure during both the on and off states. In one embodiment, the method for generating the thermal model includes, receiving temperature measurements of the electrical device taken during an on/off cycle, the on/off cycle comprising running a test current through the electrical device for a specified time period while the electrical device is in the on state and turning off the test current for a second specified time period while the electrical device is in the off state, generating an on/off cycle temperature curve of temperature versus time based on the on/off cycle temperature measurements, extracting a heating curve from the on/off cycle temperature curve, the heating curve representing both heating and cooling of the electrical device during the on cycle, extracting a cooling curve from the on/off cycle temperature curve, the cooling curve representing cooling of the electrical device during the off cycle, calculating a heating change in temperature as a function of temperature based on the extracted heating curve, calculating a cooling change in temperature as a function of temperature based on the cooling curve, generating an on/off cycle heating behavior curve by combining the heating temperature change curve and the cooling temperature change curve and generating a thermal model for the electrical device based on the on/off cycle heating behavior curve and the calculated heating change in temperature as a function of temperature and the calculated cooling change in temperature as a function of temperature.

In one embodiment, the computer program product includes programs instructions for predicting temperature as a function of time of the electrical device using the thermal model, wherein the thermal model calculates the predicted temperature as a function of time (t) by multiplying the square of the test current at time (t) by the temperature from the on/off cycle heating behavior curve at time (t-1), minus the temperature from the cooling change in temperature curve at time (t-1), plus the predicted temperature at time (t-1). In one embodiment, the computer program product program instructions for calculating the heating change in temperature as a function of temperature include calculating a derivative of the heating curve and calculating the cooling change in temperature as a function of temperature comprises calculating a derivative of the cooling curve.

BRIEF DESCRIPTION OF THE DRAWINGS

FIG. 3 is a plot showing the heating and cooling data of one pair of contactors at multiple physical points according to one embodiment of the present disclosure.

FIG. 4A is a plot that represents the heating curve from the closed state of the contactors according to one embodiment of the present disclosure.

FIG. 4B is a plot that represents the cooling curve from the open state of the contactors according to one embodiment of the present disclosure.

Further features as well as the structure and operation of various embodiments are described in detail below with reference to the accompanying drawings. In the drawings, like reference numbers indicate identical or functionally similar elements.

DETAILED DESCRIPTION

Figure 1A:
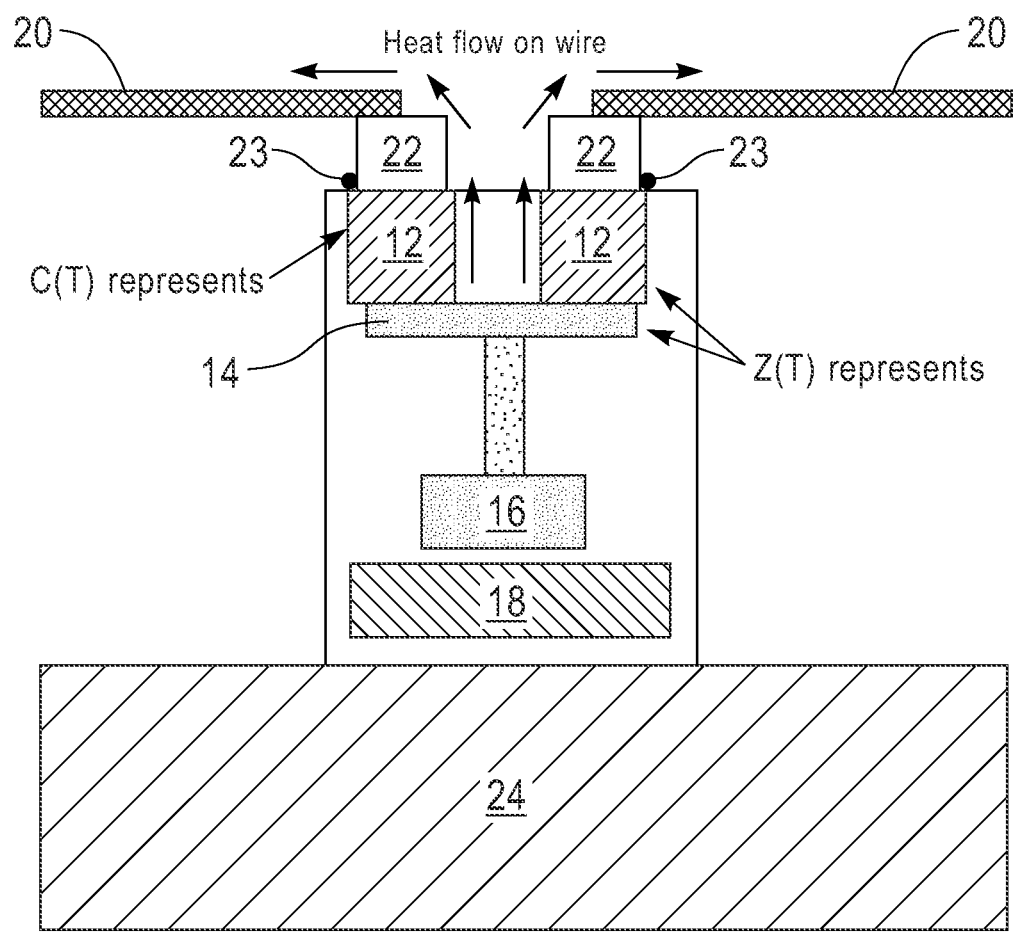
FIG. 1A a magnetic contactor that is one example of an electrical device for which a thermal model is generated according to one embodiment of the present disclosure.
Figure 1B:
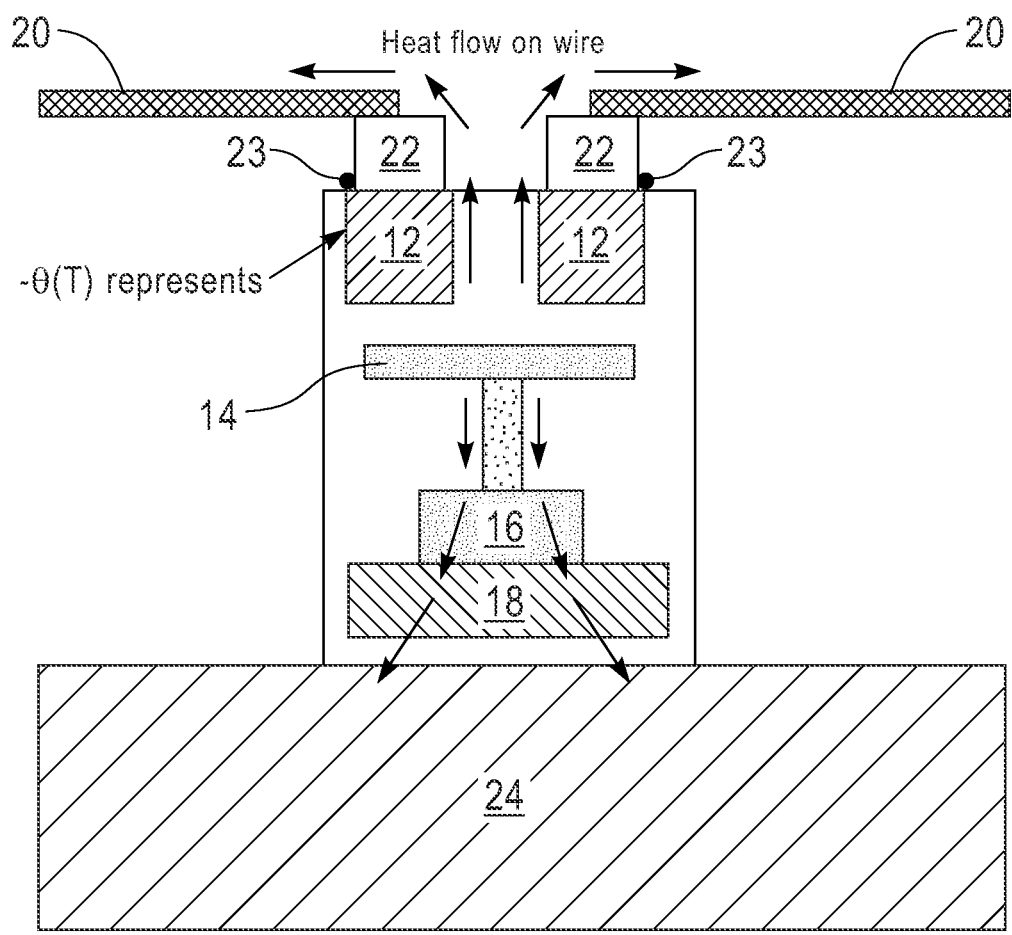
FIG. 1B a magnetic contactor that is one example of an electrical device for which a thermal model is generated according to one embodiment of the present disclosure.

In one embodiment, a method for generating a thermal model for an electrical device is disclosed in which the device has two mechanical states, such as an on state and an off state. Examples of such devices are a contactor, a circuit breaker, a solenoid and a relay. FIGS. 1A and 1B are diagrams of one example of an electrical device for which a thermal model is generated. The device in FIGS. 1A and 1B is a magnetic contactor 10. As shown on FIG. 1A, the contactor 10 has a pair of top contacts 12 and a bottom contact 14. The bottom contact 14 is connected to a magnet 16. Contactor 10 also includes electromechanical coil 18. The contactor 10 is connected to a load (not shown) by attaching wires 20 to a pair of terminals 22 connected to top contacts 12.

The contactor 10 has an on state in which the contacts 12 and 14 are closed connecting the contactor to a load drawing current through the wires 20 as shown in FIG. 1A. The contactor 10 also has an off state in which the contacts 12 and 14 are open disconnecting the contactor from the load. In one embodiment, the contactor 10 may be connected to a cooling structure such as a cold chassis 24 during both the on and off states.

Typically, contactor 10 is connected in a circuit between a power source and the load. When the contactor 10 is in the closed state, as shown in FIG. 1A, current is drawn through the wires 20 from the power source to the load. The contactor is designed to protect the load from damage caused by a fault in the circuit. Upon detection of the occurrence of a fault, the electromagnetic coil 18 is energized causing the magnet 16 to be drawn to the coil 18, which switches the contactor 10 to the open state by disconnecting the bottom contact 14 from the top contact 12 as shown in FIG. 1B.

During the period of the contactor 10 being in the on state, the current causes heat to be generated. The cold chassis 24 is designed to withdraw some of the heat to protect the contactor from failure due to thermal overload. Therefore, in the closed state, both heating and cooling are taking place within the contactor 10. When the contactor 10 is in the open state, heat is no longer being generated by the current, however, the cold chassis 24 operates to continue to remove heat thereby providing a cooling effect on the contactor 10.

Figure 2:
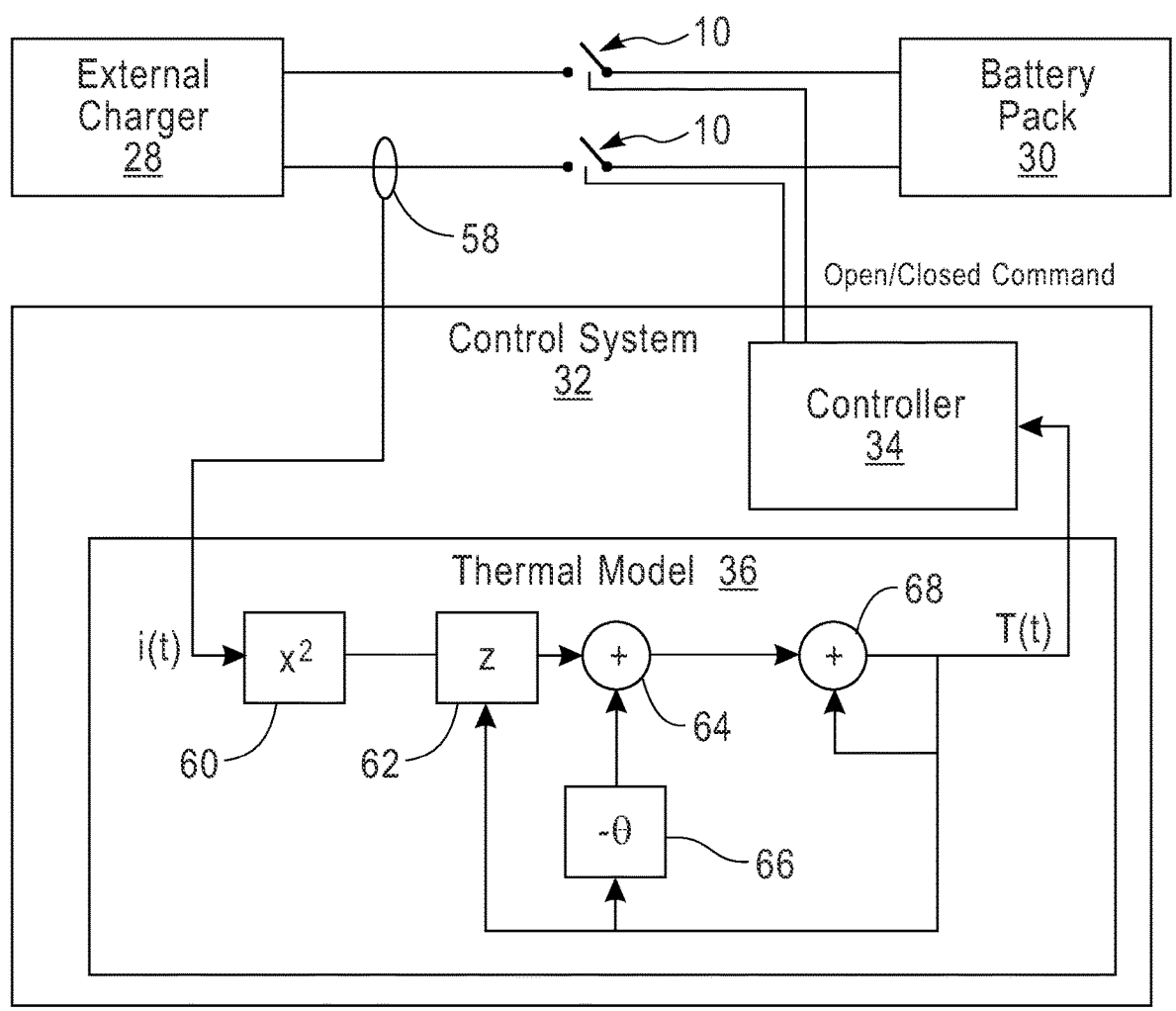
FIG. 2 is a block diagram of a system according to one embodiment of the present disclosure.
Figure 7:
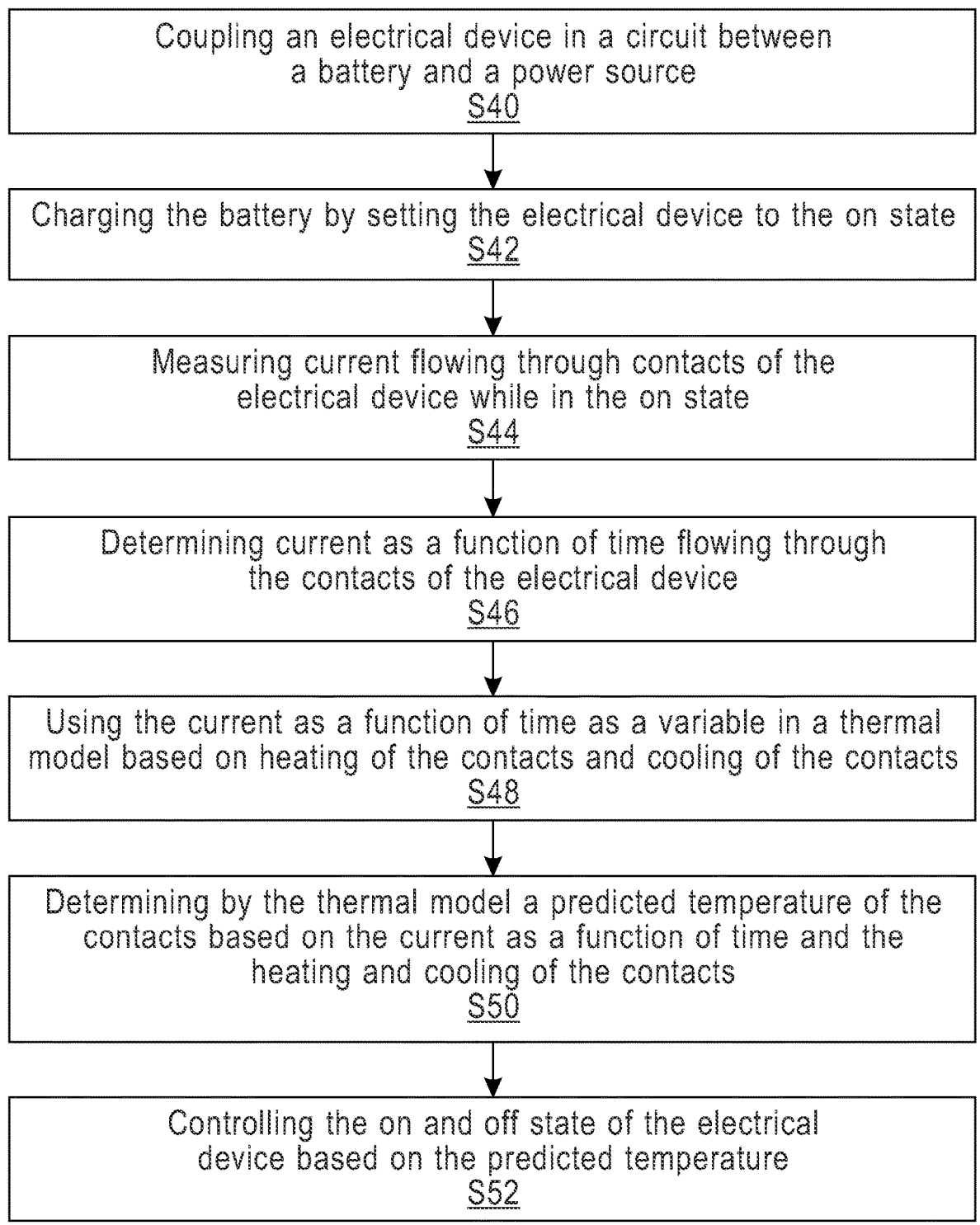
FIG. 7 is a flow diagram of one embodiment of a method for charging a battery according to one embodiment of the present disclosure.
Figure 8:
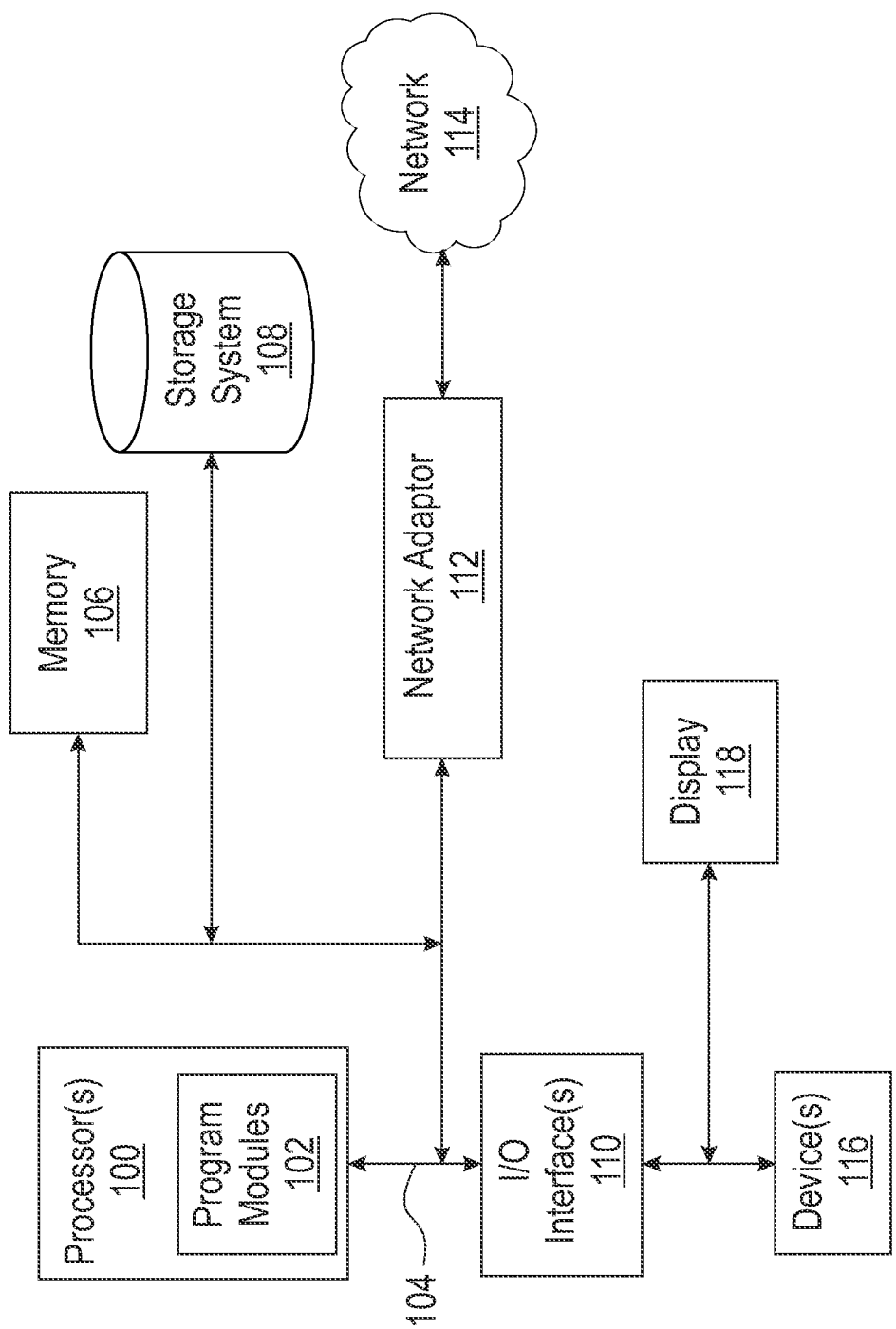
FIG. 8 is a block diagram of an exemplary computing system suitable for implementation of the embodiments disclosed in this specification.

One use of contactors 10 is in a circuit for charging a battery pack for an electric vehicle or hybrid electric vehicle. As shown in FIG. 2, a pair of contactors 10 are connected a circuit 26 between an external charger 28 and a battery pack 30. To protect the contactor 10 from thermal overload, a control system 32 is provided. The control system 32 includes a controller 34. In one embodiment, controller 34 controls the charging current based on the thermal model 36. In another embodiment, the controller 34 controls the charging time based on a thermal model 36. In one embodiment, the control system 32 may be implemented by a computer processing system as shown in FIG. 7, described later.

In one embodiment, a particular test was run many times on many sets of contactors 10 in order to acquire temperature data for each set. The test consisted of running current through the set of contactors for a specific amount of time and then turning off the current. When the current was commanded OFF the contactors were simultaneously commanded OPEN. As a result, the contactors would heat from ambient to a maximum value, at which point, they would begin to cool. Data was collected at multiple physical points on the pair of contactors. As shown in FIGS. 1A and 1B, in one embodiment, thermocouples 23 were placed at each terminal 22.

The data was plotted, and FIG. 3 is a plot showing the heating and cooling data of one pair of contactors 10 at multiple physical points. The y-axis is temperature in C and the x-axis is time in seconds. The data 40 on the left side of the peak 42 is from the time the contacts were closed. During this time, heat was being generated due to the current flowing and cooling was being effected by the cooling chassis 24 attached to the contactors. In addition, heat will be removed by the wires 20, as the wires themselves act as a heat sink. The data 44 on the right side of the peak 42 is cooling caused by the cooling effect of the cold chassis 24 being attached to each of the contactors when heat was no longer being generated.

In one embodiment, the hottest set of data was chosen to represent the model for that pair of contactors in order to provide a margin of safety. The heat curve on the left side 40 and cooling curve on the right side 44 corresponding to the hottest line in the plot of FIG. 3 were extracted and separated. Once separated, the two curves were fitted using high order polynomials. Once the fits were calculated, the heating curve as a function of time, heat(t), and the cooling curve as a function of time, cooling(t), they were differentiated with respect to time to obtain a differential heat curve heat'(t) and a differential cooling curve, cooling'(t).

For each curve, the derivative was plotted versus the original fit, which made two plots. The first plot, shown in FIG. 4A, is of heat'(t) vs. heat(t). The curve 46 in FIG. 4A represents the heating curve from the closed state of the contactors. The second plot, shown in FIG. 4B, is of cooling'(t) vs. cooling(t). The curve 48 in FIG. 4B represents the cooling curve from the open state of the contactors. These plots are essentially the change in temperature, $\Delta T$, vs. temperature, T. Therefore, at a particular temperature and state, the change in temperature can be calculated. The data in FIGS. 4A and 4B may alternatively be obtained by simulation.

The plots shown in FIGS. 4A and 4B were used to create the model. The following variables $\theta$, C, and Z, were defined as:

$$\theta(T) = OFF \text{ State } \Delta T(T) \quad (1)$$

$$C(T) = ON \text{ State } \Delta T(T) \quad (2)$$

$$Z(T) = \theta(T) + C(T) \quad (3)$$

Figure 5:
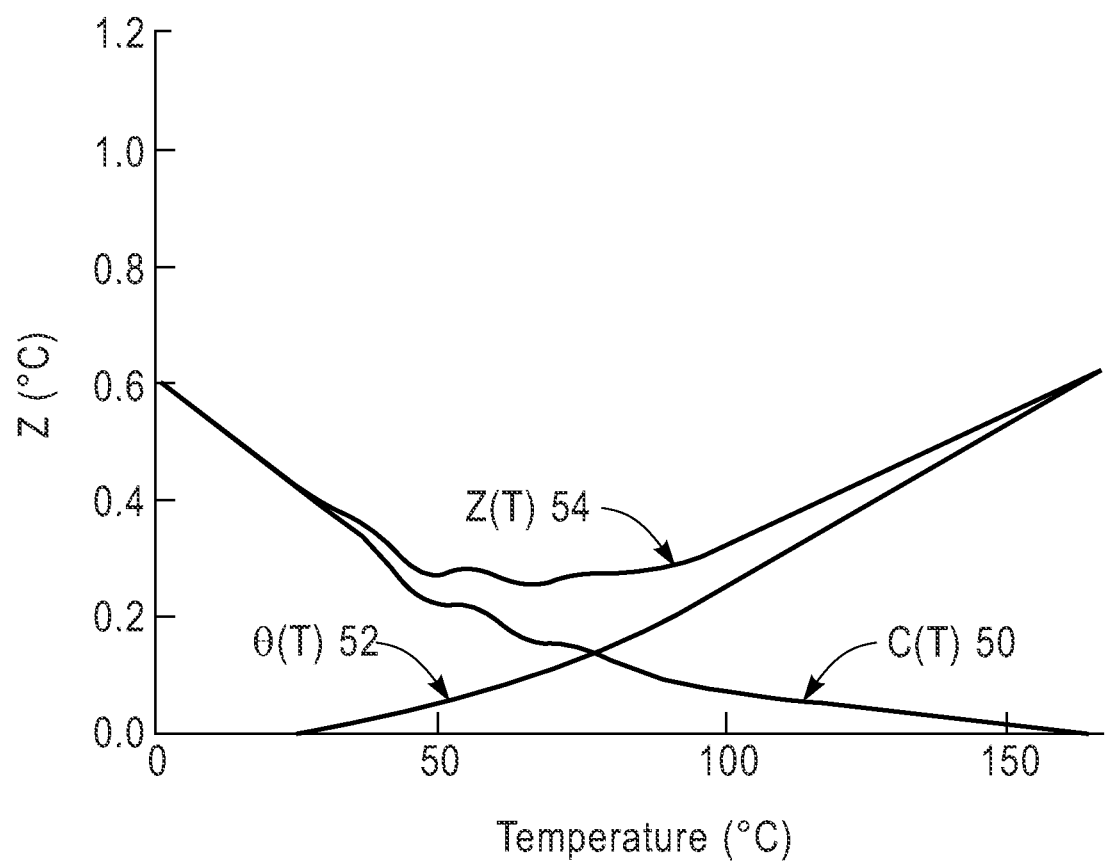
FIG. 5 shows the plots of the three variables of the thermal model according to one embodiment of the present disclosure.

FIG. 5 shows the plots of the three variables. Curve 50 is C(T), curve 52 is $\theta$(T) and curve 54 is Z(T). C(T) shown by curve 50 is the curve obtained from heating data while the contactor is in the closed state and represents a heating variable gain of the contactors. $\theta$(T) shown by curve 52 is the curve obtained from cooling data while the contactor is in the open state and represents a cooling variable gain of the contactors. Z(T) shown by curve 54 is the curve that describes heating behavior of a full on/off cycle. This is because of the nature of the two states. In the closed state, there is heating and cooling. In the open state, there is just cooling. Z(T) represents both heating and cooling.

Using the equations (1), (2) and (3) above, a thermal model that incorporates the heating and cooling variable gains of the contactors, as shown by Equation 4, was created.

$$T(t) = \left( \frac{i(t)^2}{(650A)^2} Z(T(t-1)) - \theta(t-1) \right) + T(t-1) \quad (4)$$

In the thermal model of Equation (4), the current was normalized to one charging current, 650A. Once normalized, the variable gain model could predict temperature of a set of contactors given any charge length and state pattern. The normalization may be to any chosen specific charging current or could be eliminated as normalization is optional.

In one embodiment, the thermal model is a recursive model, meaning that each temperature point was calculated based on the previous temperature, i.e. at time (t-1). Due to the recursive nature of the model, an initial temperature condition should be specified.

Referring back to FIG. 2, thermal model 36 is illustrated as a block diagram representation of the thermal model of Equation (4). For the contactor device example, current sensor 58 detects the current in the circuit 26 and the current as a function of time i(t) is input to a multiplier 60 that squares the input current. As noted herein, the flow of current changes the temperature. $I^2(t)$ is input to module 62. Module 62 calculates Z(T) using Equation (3) and multiplies Z(T) by $i^2(t)$.

The output of module 62 may be normalized, such as for example by the square of 650A, but as noted above, normalization is optional. The output $Z(T)i^2(t)$, which may or may not be normalized is input to adder 64. Module 66 calculates θ(T) using equation (1). In one embodiment, the negative of θ(T) is input to adder 64. The reason the cooling curve θ(T) is added rather than subtracted is because the data itself was negated earlier for ease of plotting.

Alternatively, in another embodiment, element 64 may be a subtractor and θ(T) is input to subtractor 64. In one embodiment Z(T) and θ(T) are calculated at time (t-1) making the model recursive. The output of adder/subtractor 64 is $$\left(\frac{i(t)^2}{(650A)^2}Z(T(t-1))-\theta(t-1)\right),$$

which is ΔT.

The previously calculated temperature T is added to ΔT at adder 68. The output of adder 68 is the predicted temperature of the contactor pair as a function of time. The block diagram of FIG. 2 shows the iterative structure of the model. It can be observed that when i(t)=0, Z becomes zero and the temperature, T(t), is dominated by the cooling gain, θ.

In one embodiment, the thermal model 36 can be used to determine a time of charging at which the contactor 10 fails. This time can be used by controller 34 to charge the battery pack 30 for a time less than the determined contactor fail time. In another embodiment, the thermal model 36 can be used to determine the charging current at which the contactor 10 would fail. The controller 34 can be programmed to limit the charging current to be below this amount so that the contractor 10 does not reach the point of thermal failure as determined by a thermal feedback device.

Figure 6:
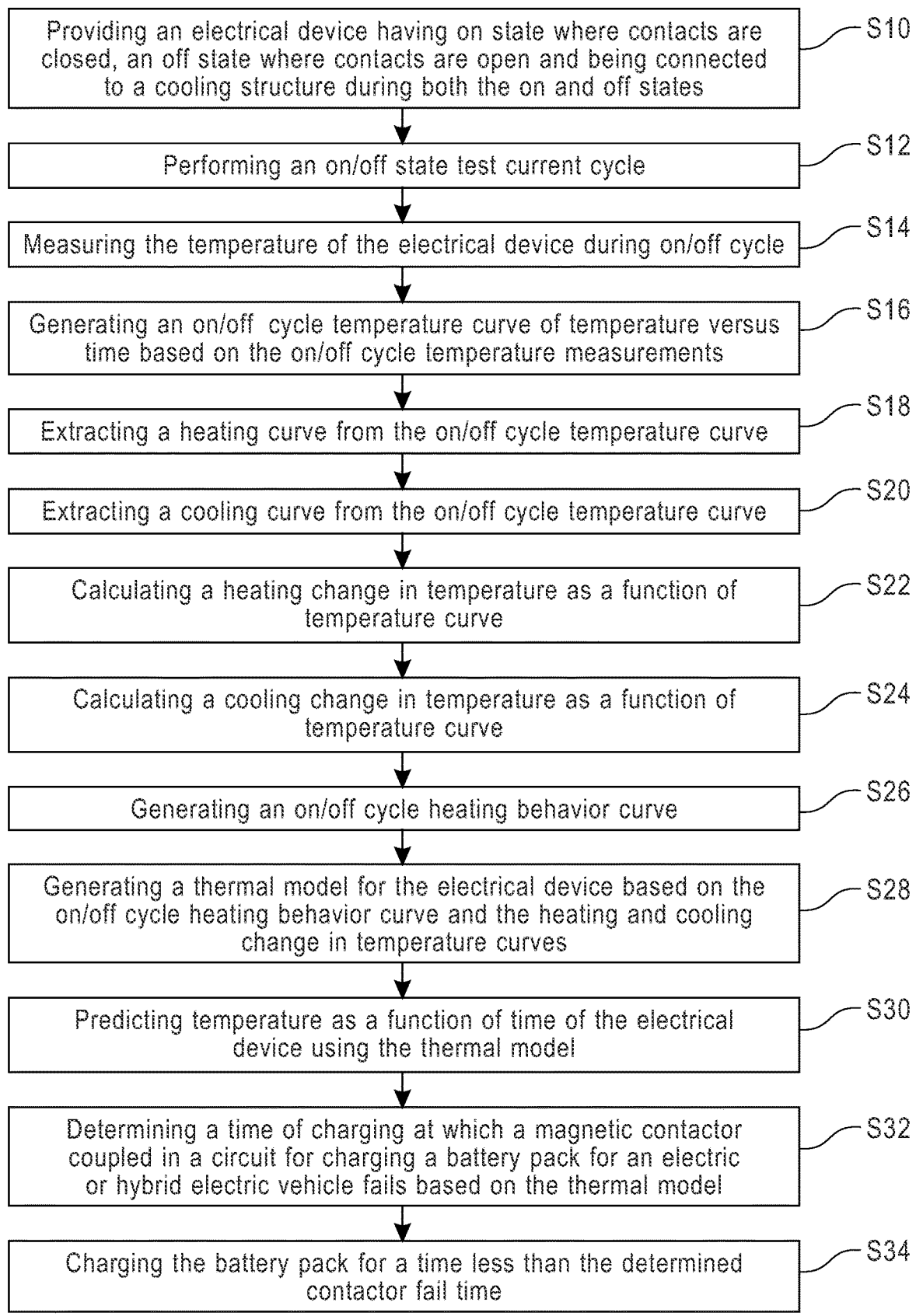
FIG. 6 is a flow diagram of one embodiment of a method for generating a thermal model for an electrical device according to one embodiment of the present disclosure.

FIG. 6 is a flow diagram of one embodiment of a method for generating a thermal model for an electrical device. Step S10 includes providing an electrical device having electrical contacts, wherein in an on state the contacts are closed connecting the electrical device to a load drawing current and in an off state the contacts are open disconnecting the electrical device from the load, the electrical device being connected to a cooling structure during both the on and off states. Step S12 includes performing an on/off cycle by running a test current through the electrical device for a specified time period while the electrical device is in the on state and turning off the test current for a second specified time period while the electrical device is in the off state. Step S14 includes measuring the temperature of the electrical device during the on/off cycle. Step S16 includes generating an on/off cycle temperature curve of temperature versus time based on the on/off cycle temperature measurements. Step S18 includes extracting a heating curve from the on/off cycle temperature curve, the heating curve representing both heating and cooling of the electrical device during the on cycle.

Step S20 includes extracting a cooling curve from the on/off cycle temperature curve, the cooling curve representing cooling of the electrical device during the off cycle. Step S22 includes calculating a heating change in temperature as a function of temperature curve based on the extracted heating curve. Step S24 includes calculating a cooling change in temperature as a function of temperature curve based on the extracted cooling curve. Step S26 includes generating an on/off cycle heating behavior curve by combining the heating temperature change curve and the cooling temperature change curve. Step S28 includes generating a thermal model for the electrical device based on the on/off cycle heating behavior curve and the calculated heating change in temperature as a function of temperature and the calculated cooling change in temperature as a function of temperature. In one embodiment, step S30 includes predicting temperature as a function of time of the electrical device using the thermal model. In one embodiment, step S32 includes determining a time of charging at which a magnetic contactor coupled in a circuit for charging a battery pack for an electric or hybrid electric vehicle fails based on the thermal model. In one embodiment, step S34 includes charging the battery pack for a time less than the determined contactor fail time. In one embodiment, step S32 may include determining the charging current at which the contactor would fail and step 34 may include limiting the charging current to be below the fail current amount so that the contractor does not reach the point of thermal failure.

In one embodiment, step S22 of calculating the heating change in temperature as a function of temperature includes calculating a derivative of the heating curve. In on embodiment, step S22 of calculating the cooling change in temperature as a function of temperature includes calculating a derivative of the cooling curve. In one embodiment, the thermal model of step S28 is recursive such that the predicted temperature at each time point of the function is based on the predicted temperature at the immediate previous time point. In one embodiment, step S30 of predicting temperature as a function of time is based on current as a function of time. In one embodiment, step S30 includes the thermal model calculating the predicted temperature as a function of time (t) by multiplying the square of the test current at time (t) by the temperature from the on/off cycle heating behavior curve at time (t-1), minus the temperature from the cooling change in temperature curve at time (t-1), plus the predicted temperature at time (t-1). In one embodiment, the test current is normalized in the predicted temperature calculation of step S30 by dividing the square of the test current at time (t) by predetermined current value.

FIG. 7 is a flow diagram of one embodiment of a method for charging a battery. In step S40 includes coupling an electrical device in a circuit between the battery and an electrical power source. In some embodiments, the electrical device has an on state configured to connect the power source to the battery and an off state configured to disconnect the power source from the battery. In some embodiments, the on and off states are mechanically different states of the electrical device. Step S42 includes charging the battery by setting the electrical device to the on state. Step S44 includes measuring current flowing through contacts of the electrical device while the electrical device is in the on state. Step S46 includes determining current as a function of time flowing through the contacts of the electrical device. Step S48 includes using the current as a function of time as a variable in a thermal model based on heating of the contacts and cooling of the contacts. Step S50 includes determining by the thermal model a predicted temperature of the contacts based on the current as a function of time and the heating and cooling of the contacts. Step 52 includes controlling the on and off state of the electrical device based on the predicted temperature.

FIG. 7 is a block diagram of an example computer or processing system that may implement the method for predicting temperature as a function of time of an electrical device in one embodiment of the present disclosure. The computer system is only one example of a suitable processing system that may be used to implement the method for predicting temperature as a function of time of an electrical device, such as the embodiment shown in flow chart of FIG. 6, and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The components of computer system may include, but are not limited to, one or more processors or processing units 100, a system memory 106, and a bus 104 that couples various system components including system memory 106 to processor 100. The processor 100 may include a program module 102 that performs the methods described herein. The module 102 may be programmed into the integrated circuits of the processor 100, or loaded from memory 106, storage device 108, or network 114 or combinations thereof.

Bus 104 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system may include a variety of computer system readable media. Such media may be any available media that is accessible by computer system, and it may include both volatile and non-volatile media, removable and non-removable media.

System memory 106 can include computer system readable media in the form of volatile memory, such as random access memory (RAM) and/or cache memory or others. Computer system may further include other removable/non-removable, volatile/non-volatile computer system storage media. By way of example only, storage system 108 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

The computer system may also communicate with one or more external devices 116 such as a keyboard, a pointing device, a display 118, etc.; one or more devices that enable a user to interact with computer system; and/or any devices (e.g., network card, modem, etc.) that enable computer system to communicate with one or more other computing devices. Such communication can occur via Input/Output (I/O) interfaces 110.

Still yet, the computer system can communicate with one or more networks 114 such as a local area network (LAN), a general wide area network (WAN), and/or a public network (e.g., the Internet) via network adapter 112. As depicted, network adapter 112 communicates with the other components of computer system via bus 104. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the network address configuration methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other components and functionality not reflected in the illustrations will be apparent in light of this disclosure, and it will be appreciated that other embodiments are not limited to any particular hardware or software configuration. Thus, in other embodiments system may comprise additional, fewer, or alternative subcomponents as compared to those included in the example embodiments.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments disclosed herein. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure not be limited by this detailed description, but rather by the claims appended hereto. Future filed applications claiming priority to this application may claim the disclosed subject matter in a different manner, and may generally include any set of one or more elements as variously disclosed or otherwise demonstrated herein.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for charging a battery, comprising:
   coupling an electrical device in a circuit between the battery and an electrical power source, the electrical device having an on state configured to connect the power source to the battery and an off state configured to disconnect the power source from the battery, the on and off states being mechanically different states of the electrical device;
   charging the battery by setting the electrical device to the on state;
   measuring current flowing through contacts of the electrical device while the electrical device is in the on state;
   determining current as a function of time flowing through the contacts of the electrical device;
   using the current as a function of time as a variable in a thermal model based on heating of the contacts and cooling of the contacts;
   determining by the thermal model a predicted temperature of the contacts based on the current as a function of time and the heating and cooling of the contacts; and
   controlling the on and off state of the electrical device based on the predicted temperature.

2. The method of claim 1, wherein the electrical device is a contactor coupled in a circuit for charging a battery pack for an electric or hybrid electric vehicle.

3. The method of claim 2, further comprising determining at least one of a time of charging the battery pack at which the contactor fails based on the thermal model, and a current for charging the battery pack at which the contactor fails based on the thermal model.

4. The method of claim 3, further comprising in the case of determining a time of charging at which the contactor fails, controlling the on and off state of the contactor for charging the battery pack for a time less than the determined contactor fail time, and in a case of determining a charging current at which the contactor fails, controlling the on and off state of the contactor for charging the battery pack with a current less than the determined contactor failure current.

5. The method of claim 1, wherein the electrical device includes a cooling structure coupled to the electrical device such that in the on state the contacts are subject to heating and cooling and in the off state the contacts are subject to cooling.

6. The method of claim 1, further comprising:
   performing an on/off cycle by running a test current through the electrical device for a specified time period while the electrical device is in the on state and turning off the test current for a second specified time period while the electrical device is in the off state;
   measuring the temperature of the electrical device during the on/off cycle;
   generating an on/off cycle temperature curve of temperature versus time based on the on/off cycle temperature measurements;
   extracting a heating curve from the on/off cycle temperature curve, the heating curve representing both heating and cooling of the electrical device during the on cycle;
   extracting a cooling curve from the on/off cycle temperature curve, the cooling curve representing cooling of the electrical device during the off cycle;
   calculating a heating change in temperature as a function of temperature curve based on the extracted heating curve;
   calculating a cooling change in temperature as a function of temperature curve based on the extracted cooling curve;
   generating an on/off cycle heating behavior curve by combining the heating temperature change curve and the cooling temperature change curve; and
   generating the thermal model for the electrical device based on the on/off cycle heating behavior curve and the calculated heating change in temperature as a function of temperature and the calculated cooling change in temperature as a function of temperature.

7. The method of claim 6, wherein calculating the heating change in temperature as a function of temperature comprises calculating a derivative of the heating curve.

8. The method of claim 6, wherein calculating the cooling change in temperature as a function of temperature comprises calculating a derivative of the cooling curve.

9. The method of claim 6, wherein the thermal model is recursive such that the predicted temperature at each time point of the function is based on the predicted temperature at the immediate previous time point.

10. The method of claim 6, wherein the thermal model calculates the predicted temperature as a function of time (t) by multiplying the square of the test current at time (t) by the temperature from the on/off cycle heating behavior curve at time (t-1), minus the temperature from the cooling change in temperature curve at time (t-1), plus the predicted temperature at time (t-1).

11. The method of claim 6, further comprising performing a plurality of the an/off cycles on the electrical device, at each on/off cycle measuring the temperature of the electrical device at a different physical point on the electrical device and generating an on/off cycle temperature curve of temperature versus time for each different physical point.

12. The method of claim 11, wherein the heating curve and the cooling curve are extracted from the on/off cycle temperature curve having the highest on/off cycle temperature measurements.

13. A system for charging a battery, comprising:
an electrical device coupled in a circuit between the battery and an electrical power source, the electrical device having an on state configured to connect the power source to the battery and an off state configured to disconnect the power source from the battery, the on and off states being mechanically different states of the electrical device;
one or more computer processors;
one or more non-transitory computer-readable storage media; and
program instructions, stored on the one or more non-transitory computer-readable storage media, which when implemented by the one or more processors, cause the one or more computer processors to perform the steps of:
charging the battery by setting the electrical device to the on state;
measuring current flowing through contacts of the electrical device while the electrical device is in the on state;
determining current as a function of time flowing through the contacts of the electrical device;
using the current as a function of time as a variable in a thermal model based on heating of the contacts and cooling of the contacts;
determining by the thermal model a predicted temperature of the contacts based on the current as a function of time and the heating and cooling of the contacts; and
controlling the on and off state of the electrical device based on the predicted temperature.

14. The system of claim 13, wherein the electrical device is a contactor coupled in a circuit for charging a battery pack for an electric or hybrid electric vehicle.

15. The system of claim 14, wherein the program instructions further cause the one or more computer processors to perform determining at least one of a time of charging the battery pack at which the contactor fails based on the thermal model, and a current for charging the battery pack at which the contactor fails based on the thermal model, and wherein the program instructions further cause the one or more computer processors to perform, in the case of determining a time of charging at which the contactor fails, controlling the on and off state of the contactor for charging the battery pack for a time less than the determined contactor fail time, and in a case of determining a charging current at which the contactor fails, controlling the on and off state of the contactor for charging the battery pack with a current less than the determined contactor failure current.

16. The system of claim 13, wherein the electrical device is in the heating state when in the on state and the electrical device is on the cooling state when in the off state, and wherein the electrical device includes a cooling structure coupled to the electrical device such that in the on state the contacts are subject to heating and cooling and in the off state the contacts are subject to only cooling.

17. The system of claim 14, wherein calculating the heating change in temperature as a function of temperature comprises calculating a derivative of the heating curve, and wherein calculating the cooling change in temperature as a function of temperature comprises calculating a derivative of the cooling curve.

18. The system of claim 14, wherein the thermal model calculates the predicted temperature as a function of time (t) by multiplying the square of the test current at time (t) by the temperature from the on/off cycle heating behavior curve at time (t-1), minus the temperature from the cooling change in temperature curve at time (t-1), plus the predicted temperature at time (t-1).

19. The system of claim 14, further comprising generating the thermal model based on a plurality of the on/off cycles on the electrical device, wherein at each on/off cycle measuring the temperature of the electrical device at a different physical point on the electrical device and generating an on/off cycle temperature curve of temperature versus time for each different physical point.

20. A system for predicting temperature as a function of time of an electrical device coupled in a circuit between a battery and an electrical power source, the electrical device having an on state configured to connect the power source to the battery and an off state configured to disconnect the power source from the battery, the on and off states being mechanically different states of the electrical device, the system comprising:
one or more computer processors;
one or more non-transitory computer-readable storage media; and
program instructions, stored on the one or more non-transitory computer-readable storage media, which when implemented by the one or more processors, cause the one or more computer processors to perform the steps of:
generating an on/off cycle temperature curve of temperature versus time based on on/off cycle temperature measurements obtained by measuring the temperature of the electrical device during the on/off cycle by running a test current through the electrical device for a specified time period while the electrical device is in the on state and turning off the test current for a second specified time period while the electrical device is in the off state;
extracting a heating curve from the on/off cycle temperature curve, the heating curve representing both heating and cooling of the electrical device during the on cycle;
extracting a cooling curve from the on/off cycle temperature curve, the cooling curve representing cooling of the electrical device during the off cycle;
calculating a heating change in temperature as a function of temperature curve based on the extracted heating curve;
calculating a cooling change in temperature as a function of temperature curve based on the extracted cooling curve;
generating an on/off cycle heating behavior curve by combining the heating temperature change curve and the cooling temperature change curve; and
generating the thermal model for the electrical device based on the on/off cycle heating behavior curve and the calculated heating change in temperature as a function of temperature and the calculated cooling change in temperature as a function of temperature.

* * * * *